United States Patent
Noda et al.

(10) Patent No.: US 7,809,461 B2
(45) Date of Patent: Oct. 5, 2010

(54) WORKING APPARATUS AND WORKING METHOD FOR CIRCUIT BOARD

(75) Inventors: Takahiro Noda, Fukuoka (JP); Tadashi Endo, Fukuoka (JP); Osamu Okuda, Fukuoka (JP); Kazuhide Nagao, Fukuoka (JP)

(73) Assignee: Panasonic Corporation, Osaka (JP)

( * ) Notice: Subject to any disclaimer, the term of this patent is extended or adjusted under 35 U.S.C. 154(b) by 124 days.

(21) Appl. No.: 12/095,083

(22) PCT Filed: Nov. 24, 2006

(86) PCT No.: PCT/JP2006/323397

§ 371 (c)(1),
(2), (4) Date: May 27, 2008

(87) PCT Pub. No.: WO2007/063763

PCT Pub. Date: Jun. 7, 2007

(65) Prior Publication Data

US 2009/0125141 A1 May 14, 2009

(30) Foreign Application Priority Data

Nov. 29, 2005 (JP) ............................... 2005-343272

(51) Int. Cl.
*H01L 31/00* (2006.01)
*H01L 21/00* (2006.01)
*G06F 19/00* (2006.01)
*G01R 31/26* (2006.01)
*H01R 13/648* (2006.01)
*B23P 21/00* (2006.01)
*B23P 19/00* (2006.01)
*B29C 65/00* (2006.01)

(52) U.S. Cl. ............................ 700/121; 29/721; 29/740; 29/759; 156/273.9; 257/E21.48; 438/14; 438/107; 439/607.07; 439/607.09; 700/108; 700/109; 700/110

(58) Field of Classification Search ................... 29/721, 29/740, 759; 156/273.9; 257/E21.48; 700/121, 700/108–110; 356/237.4; 438/14, 107; 439/607.07, 439/607.09
See application file for complete search history.

(56) References Cited

U.S. PATENT DOCUMENTS 4,342,090 A * 7/1982 Caccoma et al. ................ 716/8
(Continued)

FOREIGN PATENT DOCUMENTS

JP 6-104597 4/1994
(Continued)

OTHER PUBLICATIONS

International Preliminary Report on Patentabiliy issued Jun. 12, 2008 in the International (PCT) Application No. PCT/JP2006/323397.
(Continued)

*Primary Examiner*—Albert DeCady
*Assistant Examiner*—Thomas H Stevens
(74) *Attorney, Agent, or Firm*—Wenderoth, Lind & Ponack, L.L.P.

(57) ABSTRACT

In estimating a curved surface model by approximating the shape of the board surface of a circuit board, auxiliary measurement spots are set other than measurement spots on the board surface, eligibility as a sampling displacement magnitude in estimating a curved surface model is determined according to a difference in a displacement magnitude from a work reference surface. When the sampling displacement magnitude is determined to be ineligible, a new measurement spot is reset. By this operation, a local increase and decrease in the displacement magnitude due to a discontinuity of the board surface exerts no influence on the estimation of the curved surface model, and the curved surface model approximated more closely to the shape of the actual board surface is estimated, leading to an improvement in the work quality with the working height adjusted to the proper height.

8 Claims, 9 Drawing Sheets

U.S. PATENT DOCUMENTS

| | | | | |
|---|---|---|---|---|
| 4,367,115 | A * | 1/1983 | Bohn et al. | 156/358 |
| 4,813,255 | A * | 3/1989 | Birk et al. | 72/14.4 |
| 4,868,973 | A * | 9/1989 | Fujishiro | 29/740 |
| 4,905,370 | A * | 3/1990 | Hineno et al. | 29/740 |
| 5,010,474 | A * | 4/1991 | Tsuruta et al. | 700/57 |
| 5,086,556 | A * | 2/1992 | Toi | 29/740 |
| 5,564,183 | A * | 10/1996 | Satou et al. | 29/840 |
| 5,651,176 | A * | 7/1997 | Ma et al. | 29/740 |
| 6,000,124 | A * | 12/1999 | Saito et al. | 29/830 |
| 6,640,423 | B1 * | 11/2003 | Johnson et al. | 29/740 |
| 6,722,411 | B2 * | 4/2004 | Sugimoto et al. | 156/351 |
| 7,192,150 | B2 * | 3/2007 | Miyakawa et al. | 362/33 |

FOREIGN PATENT DOCUMENTS

| | | |
|---|---|---|
| JP | 2000-269692 | 9/2000 |
| JP | 2000-299597 | 10/2000 |

OTHER PUBLICATIONS

International Search Report issued Dec. 19, 2006 in the International (PCT) Application No. PCT/JP2006/323397.

\* cited by examiner

WORKING APPARATUS AND WORKING METHOD FOR CIRCUIT BOARD

TECHNICAL FIELD

The present invention relates to a working apparatus and a working method for a circuit board to perform prescribed works related to the mounting of an electronic component on a circuit board on which the electronic component is mounted.

BACKGROUND ART

In electronic component mounting processes, a variety of works (or manufacturing processing) are performed on a circuit board through a process of carrying out coating or printing of a conductive paste or a solder paste on a work surface (hereinafter referred to as a board surface) of the circuit board, a process of mounting an electronic component on the board surface of the circuit board to which the conductive paste and the like have been coated or printed, a process of mechanically and electrically bonding the electronic component to the circuit board by thermocompression bonding and reflow, a process of dicing the circuit board into individual circuit boards when the circuit board is a multi-product board, and so on. In order to improve the electronic component mounting quality in these processes, a working height (processing height) management in performing works on the circuit board is important. An electronic component mounting apparatus disclosed in, for example, Japanese patent application publication No. 2000-299597 (Document 1) is known as one that achieves a highly accurate working height management.

According to the disclosure of Document 1, by measuring a displacement (displacement magnitude) from a mounting reference surface of the board surface on which an electronic component is to be mounted, performing approximation of the warp of the board surface by using the displacement, calculating a correction amount of the mounting height in mounting the electronic component on the board surface and correcting the mounting height on the basis of the correction amount, the mounting can be achieved by bringing the mounting surface of the electronic component in pressure contact with the board surface without excess and deficiency.

DISCLOSURE OF INVENTION

Problems to be Solved by the Invention

However, in the electronic component mounting apparatus disclosed in Document 1, the warp shape of the entire board surface is supposed on the basis of the displacement magnitude from the work reference surface in arbitrary spots of the board surface. Therefore, when a discontinuity exists due to the influences of a stepped portion, a slit, a cut portion or the like on the objective circuit board, it is concerned that a warp shape different from the surface shape of the actual board surface is supposed by the influence of a local increase and decrease in the displacement magnitude. When the mounting height is corrected on the basis of the correction amount calculated by the thus supposed warp shape, a problem that the mounting surface of the electronic component cannot be brought in pressure contact with the board surface without excess and deficiency and the mounting quality is reduced occurs. Then, the problem of the reduction in the mounting quality is also inherent in the work quality in performing a variety of works on the circuit board.

An object of the present invention is to solve the above problems and provide a working apparatus and a working method, for works on a circuit board to be subjected to prescribed works related to the mounting of an electronic component on the circuit board on which the electronic component is mounted, capable of maintaining the work quality without reducing the work quality of the circuit board even when a discontinuity exists due to the influences of a stepped portion, a slit, a cut portion or the like on the objective circuit board.

Means for Solving the Subject

In order to achieve the above object, the present invention is constructed as follows.

According to a first aspect of the present invention, there is provided a working apparatus for a circuit board, the apparatus comprising:

a measuring means for measuring a displacement magnitude of the circuit board from a work reference surface regarding at least three measurement spots set on a working surface of the circuit board and a plurality of auxiliary measurement spots whose at least one is set in the neighborhood of each of the measurement spots;

an operation means for determining whether a difference between a maximum value and a minimum value of the measurement displacement magnitudes from the work reference surface measured by the measuring means at the measurement spots and the auxiliary measurement spots set in the neighborhood of the measurement spot is not greater than a threshold value, estimating a shape of the working surface of the circuit board by a curved surface model on the basis of the measurement displacement magnitude of each of the measurement spots determined to be not greater than the threshold value and calculating an operation displacement magnitude of the curved surface model from the work reference surface; and a correcting means for correcting a working height in performing works on the working surface of the circuit board on the basis of the operation displacement magnitude of the curved surface model calculated by the operation means.

According to a second aspect of the present invention, there is provided the working apparatus for a circuit board as defined in the first aspect, further comprising:

an adaptability determining means for comparing the operation displacement magnitude at each of the measurement spots of the curved surface model calculated by the operation means with the measurement displacement magnitudes at each of the measurement spots to determine whether a difference between both of the displacement magnitudes is not greater than a threshold value and determining that the curved surface model is adapted upon determining that the difference is not greater than the threshold value.

According to a third aspect of the present invention, there is provided the working apparatus for a circuit board as defined in the first aspect, wherein the operation means estimates, for each of a plurality of compartment working surfaces obtained by comparting the working surface of the circuit board into a plurality of regions, a shape of the compartment working surface by the curved surface model on the basis of the measurement displacement magnitude.

According to a fourth aspect of the present invention, there is provided a working method for a circuit board, the method comprising:

setting at least three measurement spots on a working surface of the circuit board;

measuring a measurement displacement magnitude from a work reference surface of the circuit board at each of the set measurement spots;

determining whether the measurement displacement magnitude at the measured measurement spot is eligible as a sampling displacement magnitude;

setting upon determination of ineligibility a new measurement spot in place of the measurement spot that has been determined to be ineligible and measuring the measurement displacement magnitude to determine eligibility of the new measurement displacement magnitude, or estimating upon determination of eligibility a shape of the working surface of the circuit board by a curved surface model on the basis of the measurement displacement magnitude at the measurement spot and calculating an operation displacement magnitude of the curved surface model from the work reference surface; and performing works on the circuit board by correcting a working height in performing works on the working surface of the circuit board on the basis of the calculated operation displacement magnitude of the curved surface model.

According to a fifth aspect of the present invention, there is provided the working method for a circuit board as defined in the fourth aspect, wherein at least one auxiliary measurement spot is set in the neighborhood of each of the measurement spots in setting the measurement spots, the measurement displacement magnitude of each auxiliary measurement spot is measured in measuring the measurement displacement magnitude, and it is determined that the displacement magnitude is eligible in determining the eligibility of the displacement magnitude when a difference between a maximum value and a minimum value of the measurement displacement magnitudes of the measurement spots and the auxiliary measurement spots set in the neighborhood of the measurement spots at each of the measurement spots is not greater than a threshold value.

According to a sixth aspect of the present invention, there is provided the working method for a circuit board as defined in the fourth aspect, wherein it is determined, after the curved surface model is estimated, whether the estimated curved surface model is adapted to the working surface of the circuit board, and when the curved surface model is determined to be not adapted, a new curved surface model is estimated by additionally setting a new measurement spot in setting the measurement spot.

According to a seventh aspect of the present invention, there is provided the working method for a circuit board as defined in the sixth aspect, wherein, in determining the adaptability of the estimated curved surface model to the working surface of the circuit board, the operation displacement magnitude at each of the measurement spots of the curved surface model is compared with the measurement displacement magnitude at each of the measurement spots, and it is determined that the curved surface model is adapted by a fact that a difference between both of the displacement magnitudes is not greater than a threshold value.

According to an eighth aspect of the present invention, there is provided the working method for a circuit board as defined in the fourth aspect, wherein in estimating the curved surface model, a shape of a compartment working surface is estimated by the curved surface model on the basis of the measurement displacement magnitude for each compartment working surface obtained by comparting the working surface of the circuit board into a plurality of regions.

Effects of the Invention

According to the present invention, the working height can accurately be corrected by estimating a curved surface model approximated by the shape of the board surface to be subjected to works on the circuit board. Therefore, the work quality can be maintained without reducing the work quality of the circuit board even when a discontinuity exists due to the influences of a stepped portion, a slit, a cut portion or the like on the objective circuit board.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
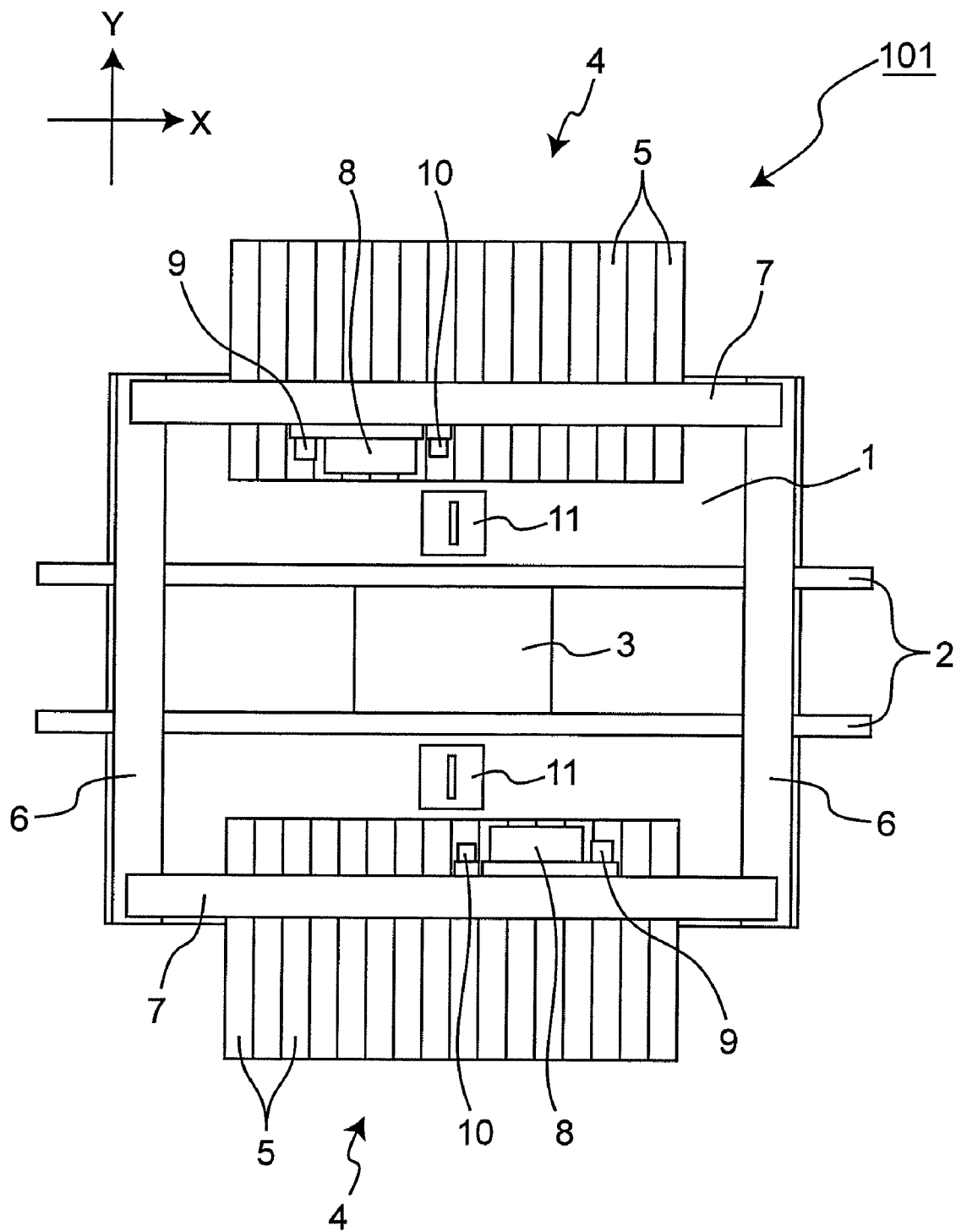
FIG. 1 is a schematic plan view of an electronic component mounting apparatus according to a first embodiment of the present invention.

Before the description of the present invention proceeds, it is to be noted that like parts are designated by like reference numerals throughout the accompanying drawings.

Hereinbelow, an embodiment of the present invention will be described in detail with reference to the accompanying drawings.

The First Embodiment

Figure 2:
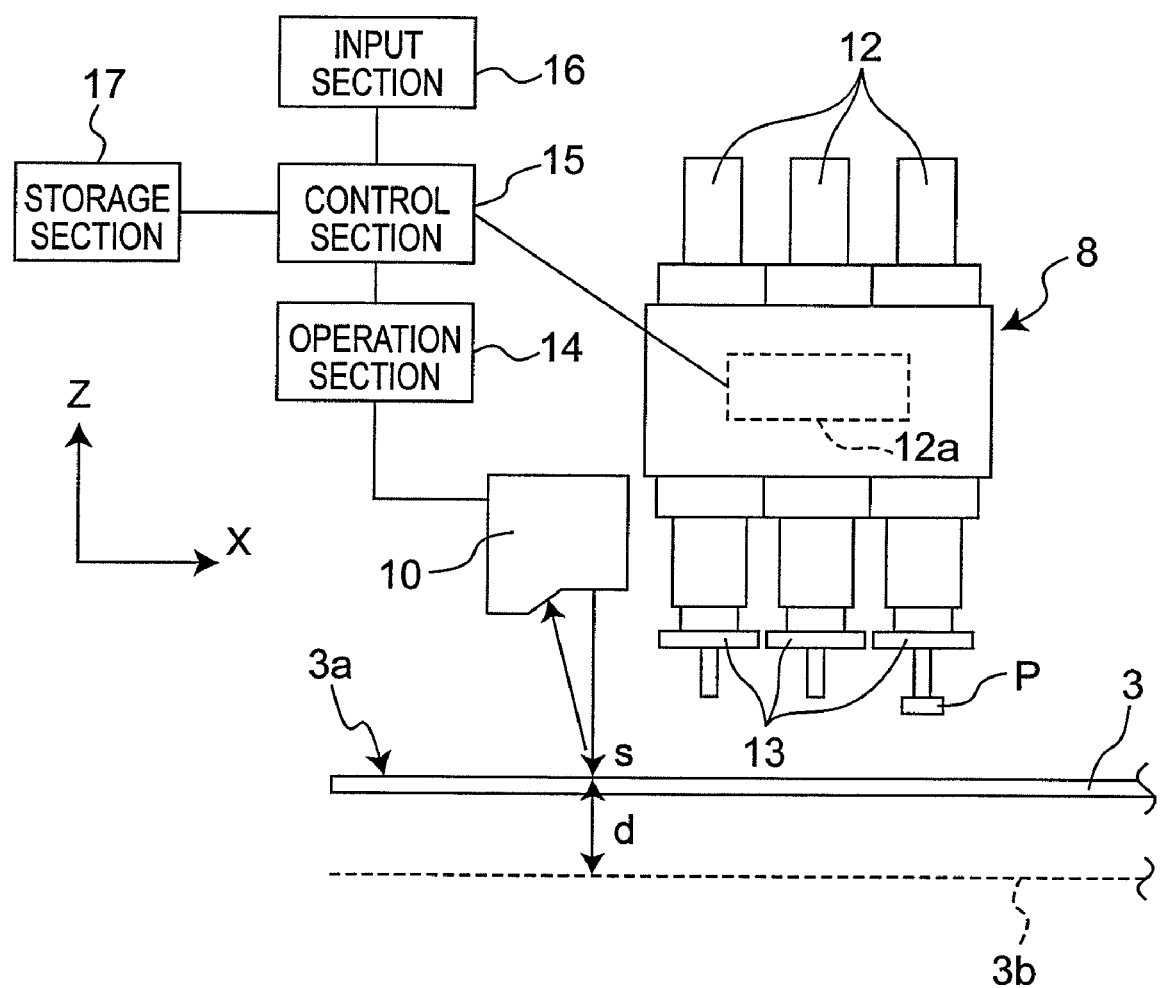
FIG. 2 is a partially schematic side view of the electronic component mounting apparatus of the first embodiment.

A schematic plan view of an electronic component mounting apparatus 101 that is one example of the working apparatus for a circuit board according to the first embodiment of the present invention is shown in FIG. 1, and its partially schematic side view is shown in FIG. 2.

First of all, the overall construction of the electronic component mounting apparatus 101 of the present first embodiment is described with reference to FIGS. 1 and 2. It is noted that the working apparatus for a circuit board in the present invention means an apparatus that carries out a variety of works (or manufacturing processing) on a work surface (hereinafter referred to as a board surface) of the circuit board while performing a working height (processing height) management. In the present first embodiment, a description is made by taking an electronic component mounting apparatus for mounting an electronic component on the board surface while managing the mounting height that is the height distance between the board surface of the circuit board and the working tool (or an electronic component held by the working tool) as an example.

In the electronic component mounting apparatus 101 of FIG. 1, a conveyance guide 2 is provided at an approximate center on a base 1. The conveyance guide 2 functions as a board position determining means for conveying a circuit board 3 on which an electronic component is to be mounted and positioning the board in a prescribed position. In the present first embodiment, it is assumed that a direction in which the circuit board 3 is conveyed is an X direction and a direction perpendicular to it in a horizontal plane is a Y direction. A component supply section 4 is provided on both sides in the Y direction of the conveyance guide 2, and a plurality of parts feeders 5 are detachably arranged side by side. A pair of Y tables 6 is provided at both end portions in the X direction of the base 1. An X table 7 is provided on the Y tables 6 and moved in the Y direction by driving the Y tables 6. A transport head 8 is provided on a side portion of the X table 7 and moved in the X direction by driving the X table 7. A camera 9 and a height detection sensor 10 are provided beside the transfer head 8. The camera 9 functions as a recognition means for recognizing the positions of the electronic component and the circuit board 3, i.e., the positions in an X-Y plane by imaging the lower portion. The Y tables 6 and the X table 7 function as horizontal displacement means for horizontally displacing the transport head 8, the camera 9 and the height detection sensor 10 into arbitrary positions on the base 1. A line camera 11 is provided between the conveyance guide 2 and the component supply section 4.

In FIG. 2, a plurality of nozzle units 12 are arranged side by side at the transport head 8 (e.g., three nozzle units 12 are arranged in a line in the present first embodiment). A nozzle 13 that sucks and holds an electronic component P and picks it up from the parts feeder 5 is attached to a lower end portion of each of the nozzle units 12. In the present first embodiment, each of the nozzles 13 serves as one example of the working tool that performs the work of mounting the electronic component on the circuit board 3. An elevation unit 12a that moves up and down the nozzle 13 in a Z direction is provided for each nozzle unit 10, so that the electronic component P is mounted on the board 3 by bringing the lower surface of the electronic component P in pressure contact with a board surface 3a by moving down the nozzle 13. It is noted that the Z direction is a direction perpendicular to the X direction and the Y direction.

Figure 3A:
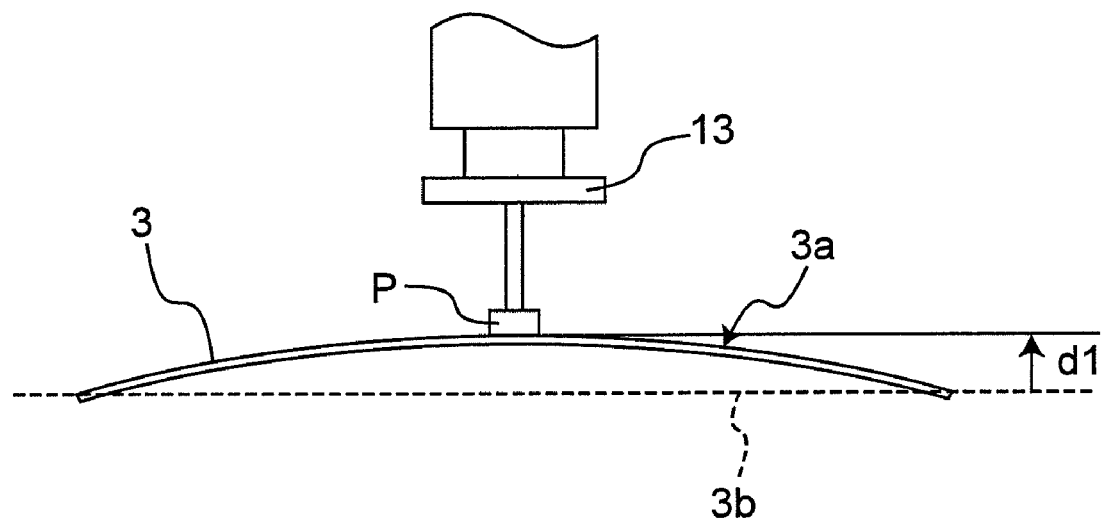
FIG. 3A is an explanatory view showing a mounting height in the electronic component mounting apparatus of the first embodiment, illustrating a state in which the end portions of the circuit board are displaced downward.
Figure 3B:
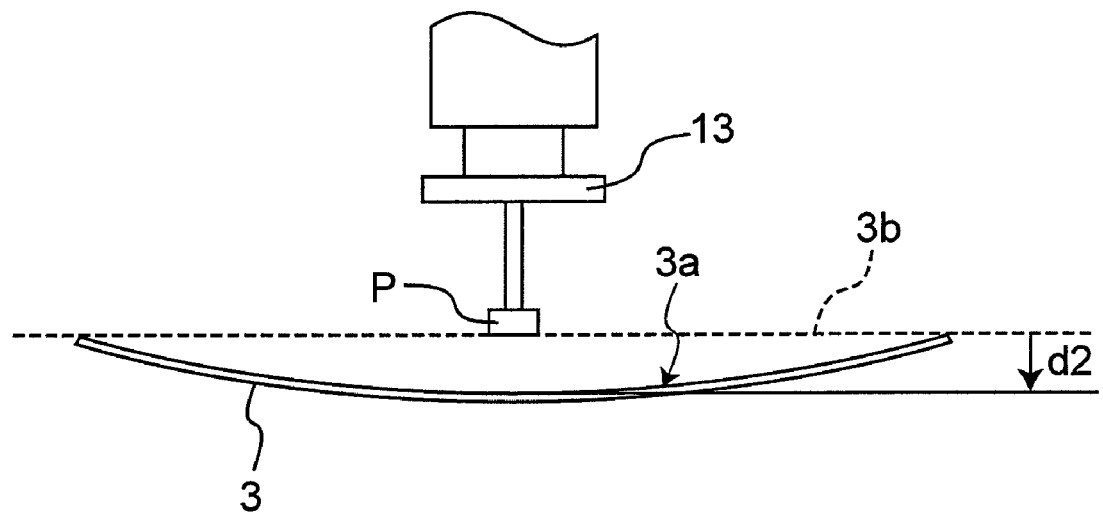
FIG. 3B is an explanatory view showing the mounting height in the electronic component mounting apparatus of the first embodiment, illustrating a state in which the end portions of the circuit board are displaced upward.

The height detection sensor 10 detects the height of the board surface 3a, i.e., a position in the Z direction by projecting laser light to a measurement spot s on the board surface 3a and receiving reflected light. The detection result by the height detection sensor 10 is subjected to an arithmetic processing in an operation section 14, and a displacement magnitude (hereinafter referred to as a displacement magnitude) d from a work reference surface 3b at the measurement spot s is measured. The height detection sensor 10 and the operation section 14 thus function as measuring means for measuring the displacement magnitude from the work reference surface 3b at the measurement spot s. It is noted that the work reference surface 3b means the board surface 3a in a state in which a flat circuit board 3 free from warp and deformation is positioned by the conveyance rail 2, and the descent stroke of the nozzle 13, i.e., the mounting height is set so that the electronic component P can be mounted by being brought in pressure contact with the work reference surface 3b without excess and deficiency. Therefore, since the board surface 3a and the work reference surface 3b do not coincide with each other when warp or deformation is occurring in the circuit board 3, the mounting height needs to be corrected in mounting the electronic component P on the circuit board 3. For example, when the board surface 3a of the circuit board 3 is deformed in a convex form with respect to the work reference surface 3b, i.e., when the board is deformed in a curve so that the end portions of the circuit board 3 are located downside as shown in the explanatory view of FIG. 3A, an upward displacement magnitude d1, which becomes the correction amount of the mounting height, is subtracted from the mounting height set in correspondence with the work reference surface 3b. On the contrary, when the board surface 3a is deformed in a concave form with respect to the work reference surface 3b, i.e., when the board is deformed in a curve so that the end portions of the circuit board 3 are located upside as shown in the explanatory view of FIG. 3B, a downward displacement magnitude d2, which becomes the correction amount of the mounting height, is added to the mounting height set in correspondence with the work reference surface 3b. As described above, it is necessary to measure the displacement magnitude of the board surface 3a from the work reference surface 3b in correcting the mounting height. Therefore, in the present first embodiment, a curved surface model that approximates the shape of the board surface 3a of the circuit board 3 is estimated, and the mounting height is corrected on the basis of the displacement magnitude from the work reference surface 3b in the curved surface model.

In FIG. 2, a control section 15 functions as a means for correcting the mounting height on the basis of the displacement magnitude from the work reference surface 3b of the curved surface model stored in a storage section 17 and performs correction of the mounting height by adjusting the descent stroke of the nozzle 13 by controlling the driving of the elevation unit 12a. The storage section 17 has a storage region in which a variety of data, a control program and so on are stored besides curved surface models. An input section 16 performs inputting of a control signal to the control section 15 and inputting of data and the program to be stored in the storage section 17.

Figure 4:
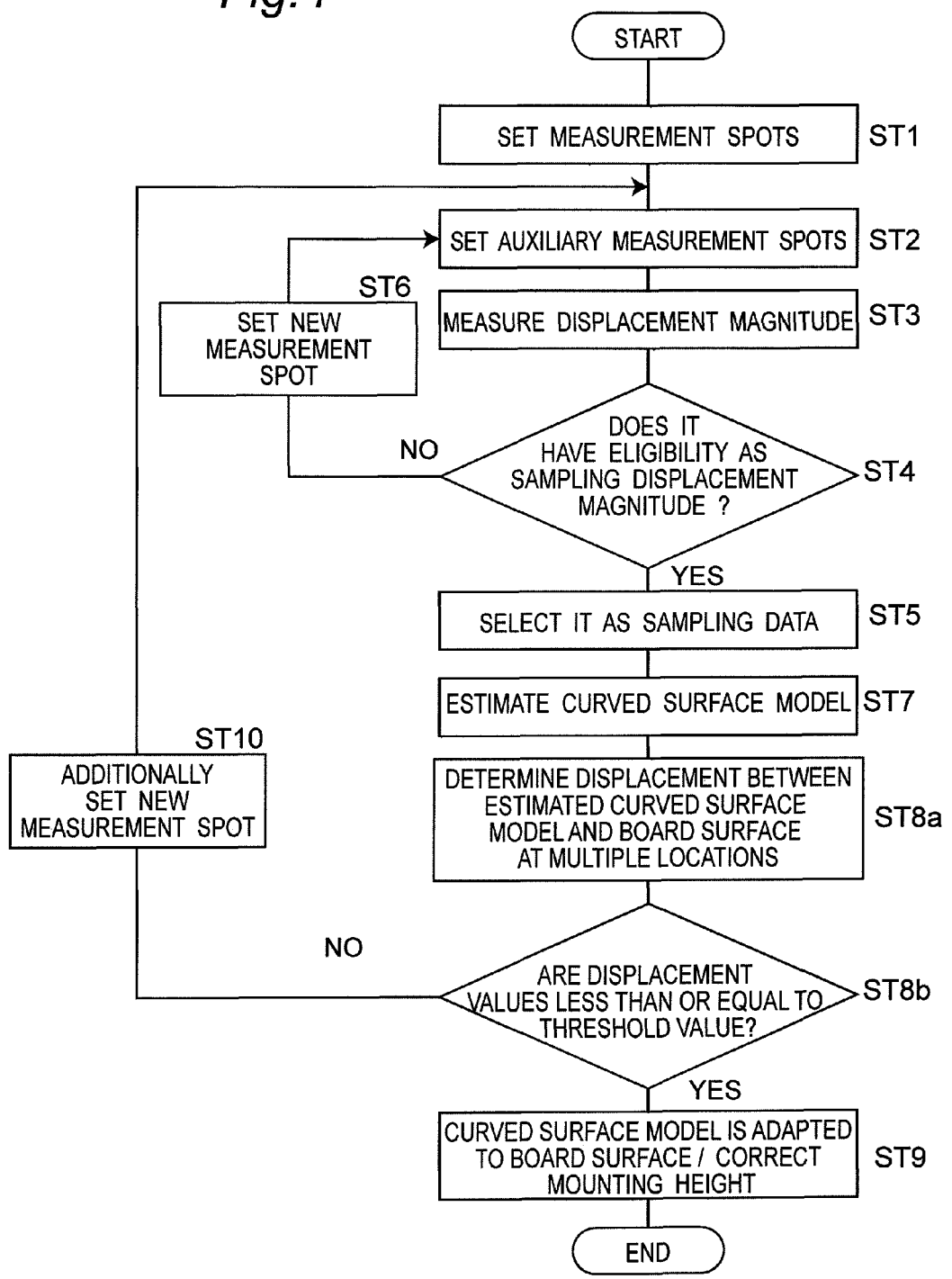
FIG. 4 is a flow chart showing mounting height correcting operation during the electronic component mounting of the first embodiment.
Figure 5A:
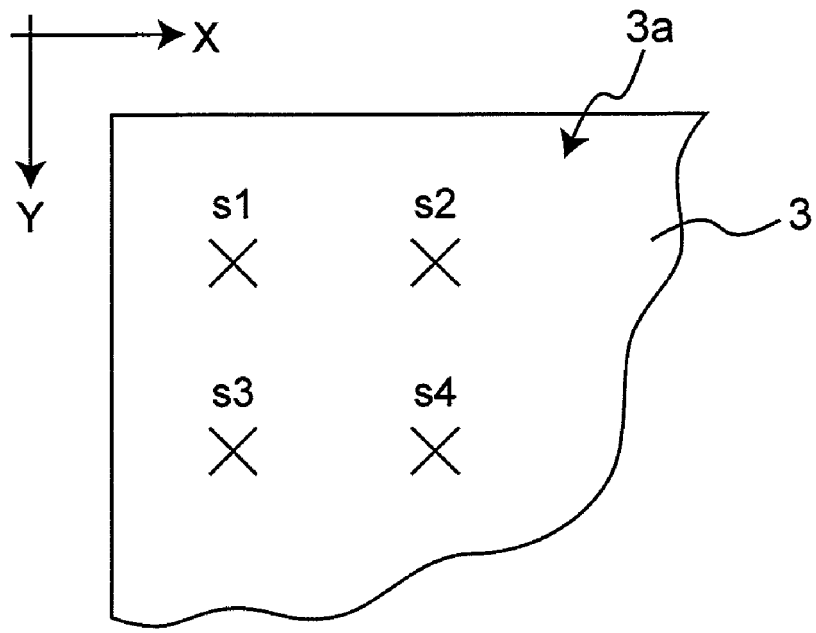
FIG. 5A is a partially schematic plan view showing measurement spots set on the board surface of the first embodiment.

Next, a procedure for correcting the mounting height by estimating a curved surface model is described with reference to the flow chart shown in FIG. 4. In estimating the curved surface model, a plurality of measurement spots are first set on the board surface 3a of the circuit board 3 (step ST1). As shown in FIG. 5A that is a partially schematic plan view of the board surface 3a of the circuit board 3, the measurement spots (s1 through s4 are illustrated) can be set by XY coordinate values on the board surface 3a by the input section 16 or may be selected from arrangement patterns preparatorily stored in the storage section 17. Moreover, it is acceptable to select an optimal arrangement pattern upon inputting the size and type of the circuit board 3, the number of measurement spots and so on by the input section 16. With regard to such a measurement spot, it is preferable to set at least three points that are not located on an identical straight line in order to estimate the curved surface model as described later, and it is more preferable to set the points in the neighborhoods of four corner portions of the circuit board 3 and midpoints between them or other points.

Figure 5B:
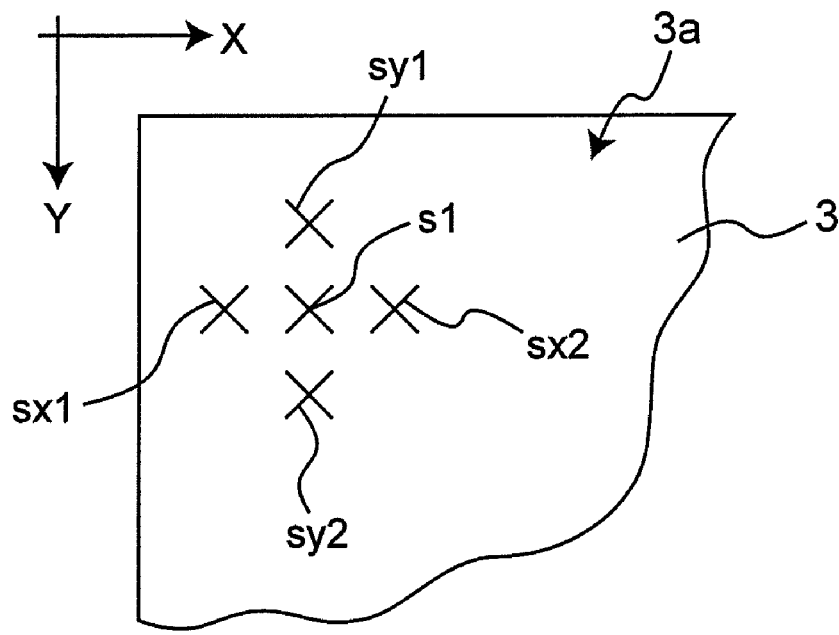
FIG. 5B is a partially schematic plan view showing auxiliary measurement spots set on the board surface of the first embodiment.

Next, at least one auxiliary measurement spot is set in the neighborhood of each measurement spot set in step ST1 (step ST2). The auxiliary measurement spots are set for each measurement spot set in step ST1. That is, the auxiliary measurement spots are set in the neighborhoods of one measurement spot while being associated with the spot. FIG. 5B, which is a partially schematic plan view of the board surface 3a, shows an example in which the auxiliary measurement spots are set in the neighborhoods of one measurement spot s1 of the measurement spots (s1 through s4 are illustrated) shown in FIG. 5A. The auxiliary measurement spots are set at four spots in total as sx1 and sx2 in the X direction and sy1 and sy2 in the Y direction around the measurement spot s1 served as a center. Although the number and arrangement of the auxiliary measurement spots can be set by arbitrary selection, it is preferable to set the spots in four directions of the measurement spot as in the present first embodiment. The auxiliary measurement spots can be set by XY coordinate values by the input section 16 or may be selected from the arrangement patterns preparatorily stored in the storage section 17. Moreover, it is acceptable that the suited arrangement pattern can be selected upon inputting the number and arrangement of the auxiliary measurement spots by the input section 16. Although not shown in FIG. 5B, four auxiliary measurement spots are set in the neighborhoods of each of the other measurement spots s2, s3 and s4.

Next, the displacement magnitudes at the measurement spots and the auxiliary measurement spots set in steps ST1 and ST2 are measured (step ST3). The measurement of the displacement magnitudes are performed by carrying out an arithmetic processing of the detection results by the height detection sensor 10 in the operation section 14 as described above, and the measured displacement magnitudes are temporarily stored in the storage section 17 by grouping the displacement magnitudes at each measurement spot and the auxiliary measurement spots set for the measurement spot as a set into one group. In the example shown in FIG. 5B, a total of five displacement magnitudes at one measurement spot s1 and the four auxiliary measurement spots sx1, sx2, sy1, sy2 associated with the measurement spot s1 are stored as a set into one group. Likewise, with regard to the other measurement spots s2, s3, s4, the displacement magnitudes at each measurement spot and the auxiliary measurement spots set for the measurement spot are stored as a set in step ST2.

Next, the eligibility of the displacement magnitudes measured in step ST3 as sampling displacement magnitudes is determined (step ST4). The determination is made by calculating a difference between a maximum displacement magnitude and a minimum displacement magnitude every group of the displacement magnitudes stored in the storage section 17 and comparing the difference between the maximum displacement magnitude and the minimum displacement magnitude with a prescribed threshold value. The prescribed threshold value has preparatorily been stored in the storage section 17 and set to, for example, 0.3 mm in the present first embodiment. When the difference between the maximum displacement magnitude and the minimum displacement magnitude in the group of each displacement magnitude is not greater than the prescribed threshold value, the displacement magnitudes at the measurement spots included in the group are determined to be eligible as the sampling displacement magnitudes, and the displacement magnitudes at the measurement spots are selected as the sampling displacement magnitudes in estimating the curved surface model (step ST5).

When the difference between the maximum displacement magnitude and the minimum displacement magnitude in the group of the displacement magnitude is greater than the prescribed threshold value, the displacement magnitudes at the measurement spots included in the group are determined to be ineligible as the sampling displacement magnitudes. That is, the fact that the difference between the maximum displacement magnitude and the minimum displacement magnitude in the group is greater than the prescribed threshold value means high possibility of the existence of a discontinuity such as a local stepped portion, a slit, a cut portion or the like between the measurement spot and the auxiliary measurement spots in the neighborhoods of the spot. If the displacement magnitudes at such measurement spots are selected as the sampling displacement magnitudes in estimating of the curved surface model, the local change is disadvantageously reflected on the approximation of the shape of the board surface, and it is concerned that a curved surface model quite different from the shape of the actual board surface is estimated. Therefore, when the difference between the maximum displacement magnitude and the minimum displacement magnitude in the group is greater than the prescribed threshold value, the measurement spots included in the set are invalidated and a new measurement spot is set in the neighborhood of the measurement spot (step ST6).

In setting the new measurement spot, it is also possible to set the spots on the board surface 3a by XY coordinate values by the input section 16 as in the setting in step ST1, or it is acceptable to automatically set the spots from the arrangement patterns preparatorily stored in the storage section 17. Also for the newly set measurement spot, the setting of the auxiliary measurement spots (step ST2), the measurement of the displacement magnitudes (step ST3) and the determination of eligibility (step ST4) are carried out. When it is determined that the displacement magnitudes at the new measurement spots are eligible as the sampling displacement magnitudes in step ST4, the displacement magnitudes at the new measurement spots are selected as the sampling displacement magnitudes (step ST5).

As described above, since the displacement magnitudes at the discontinuity such as a local stepped portion, a slit or a cut portion of the board surface 3a are not selected as the sampling displacement magnitudes for estimating the curved surface model, a local increase or decrease in the displacement magnitude exerts no influence on the estimation of the curved surface model. With this arrangement, a curved surface model approximated more closely to the shape of the actual board surface 3a is estimated, and the mounting height corrected on the basis of the displacement magnitudes of the curved surface model from the work reference surface 3b is adjusted to an appropriate height, leading to an improvement in the mounting quality.

Figure 6:
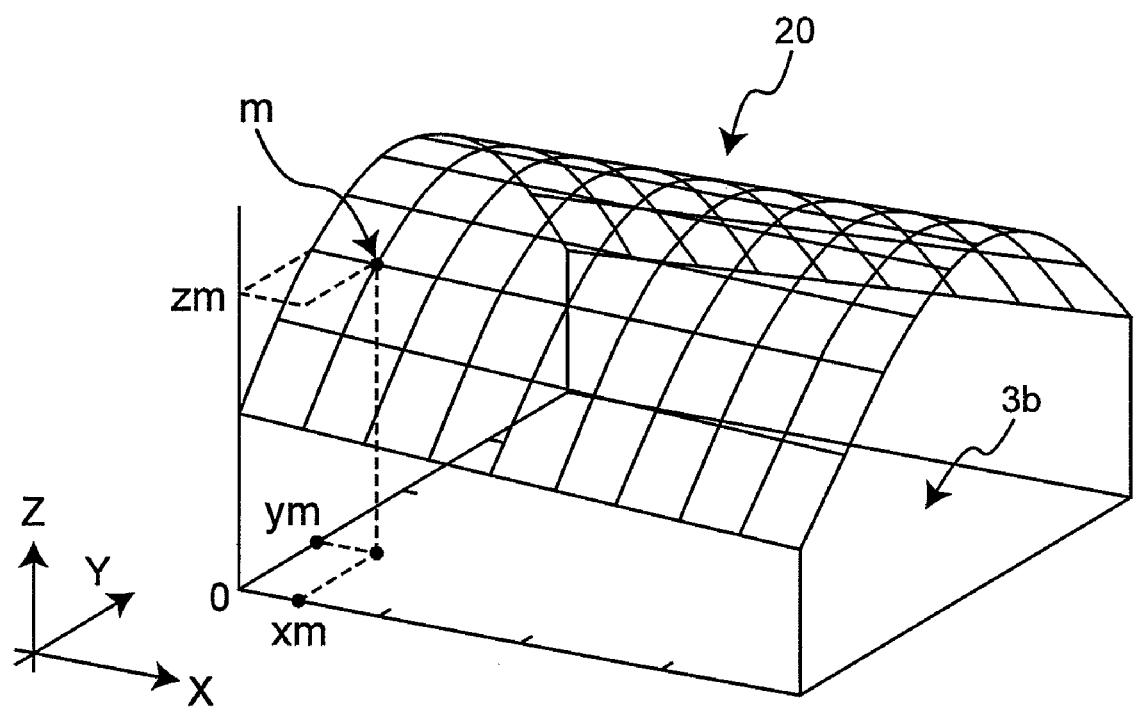
FIG. 6 is a schematic perspective view showing a curved surface model of the circuit board in the first embodiment.

Next, the curved surface model is estimated on the basis of the displacement magnitudes adopted as the sampling displacement magnitudes in step ST5 (step ST7). The curved surface model is estimated by analyzing and mathematizing the tendency of the warp and deformation of the entire board surface 3a on the basis of the sampling displacement magnitudes. FIG. 6 shows a curved surface model 20 obtained by estimating the board surface 3a where a warp deformation has occurred in a convex form with respect to the work reference surface 3b. The curved surface model 20 has been mathematized and stored in the storage section 17, and all the spots on the curved surface model 20 are expressed by an XYZ coordinate system. The operation section 14 functions as an operation means for calculating the displacement magnitudes of the curved surface model 20 from the work reference surface 3b and is able to calculate the displacement magnitudes at all spots of the curved surface model 20 from the work reference surface 3b. For example, a Z-coordinate value zm, which is the displacement magnitude at the XY coordinates (xm, ym) of the curved surface model 20, is calculated from the XY coordinates (xm, ym) of an arbitrary mounting spot m on the circuit board 3. The mounting height correction is performed by using the Z-coordinate value zm as a correction amount for the mounting on the board surface 3a.

In concrete, the estimation of the curved surface model is performed by carrying out arithmetic processing by substituting the XY coordinates (x, y) at each measurement spot of the circuit board 3 and the displacement magnitude (measurement displacement magnitude) z into an equation z=f(x, y) of the curved surface in the operation section 14. When a curved surface model where a displacement occurs in the Y direction is estimated as a comparatively simple example, the equation of the curved surface can be expressed by a quadric $z=ay^2+by+c$, and three unknowns (a, b, c) can be obtained by inputting the data of at least three measurement spots. Further, when a curved surface model where a displacement occurs additionally in the X direction is estimated, the curved surface model can be estimated by using the equation of a curved surface corresponding to it. Although it is possible to calculate the equation that expresses the curved surface model by thus concretely carrying out calculation, it may be a case where the curved surface model is estimated by preparing a plurality of types of equations of the estimated curved surfaces in advance (e.g., preparatorily stored in the storage section 17) and selecting the equation of the curved surface most closely approximated to the calculation result in order to carry out more efficient calculation.

Next, adaptability between the curved surface model 20 and the board surface 3a is determined (step ST8). The determination (step ST8a) is made as to how much displacement is between the curved surface model 20 estimated in step ST7 and the board surface 3b on the basis of a difference between the displacement magnitudes (measurement values (measurement displacement magnitudes)) at the plurality of measurement spots adopted as the sampling displacement magnitudes and the displacement magnitudes (calculated values (operation displacement magnitude)) of the curved surface model 20 calculated from the XY coordinate values of the measurement spots.

When the differences between all the measurement values (measurement displacement magnitudes) and the calculated values (operation displacement magnitudes) are each determined to be not greater than the prescribed threshold value (step ST8b), the curved surface model 20 is determined to be adapted to the board surface 3a, and the mounting height is corrected on the basis of the displacement magnitudes (operation displacement magnitudes) of the curved surface model 20 (step ST9). The prescribed threshold value has preparatorily been stored in the storage section 17 and set to, for example, 0.3 mm in the present first embodiment. On the contrary, when the difference between the measured value (measurement displacement magnitude) and the calculated value (operation displacement magnitude) is greater than the prescribed threshold value (step ST8b), the curved surface model 20 is determined to be not adapted to the board surface 3b. In such a case, a yet new measurement spot is additionally set in the neighborhood of the measurement spot of the measured value of which the difference to the calculated value exceeds the threshold value (step ST10), and a curved surface model 20 further adapted to the shape of the board surface 3a is reestimated by obtaining more detailed sample data with an increased number of measurement spots. With regard to the measurement spot that is newly additionally set, after auxiliary measurement spots are set in step ST2 and their displacement magnitudes are measured in step ST3, it is determined whether the displacement magnitudes measured in step ST4 are adapted as the sampling displacement magnitudes. When it is determined that the newly estimated curved surface model 20 is adapted to the board surface 3a again in step ST8 after the curved surface model 20 is estimated, the estimation of the curved surface model 20 is completed, and the mounting height is corrected on the basis of the displacement magnitudes of the newly estimated curved surface model 20 (step ST9). It is noted that the determination of the adaptability is made in the operation section 14, and the operation section 14 functions as an adaptability determining means.

Figure 7:
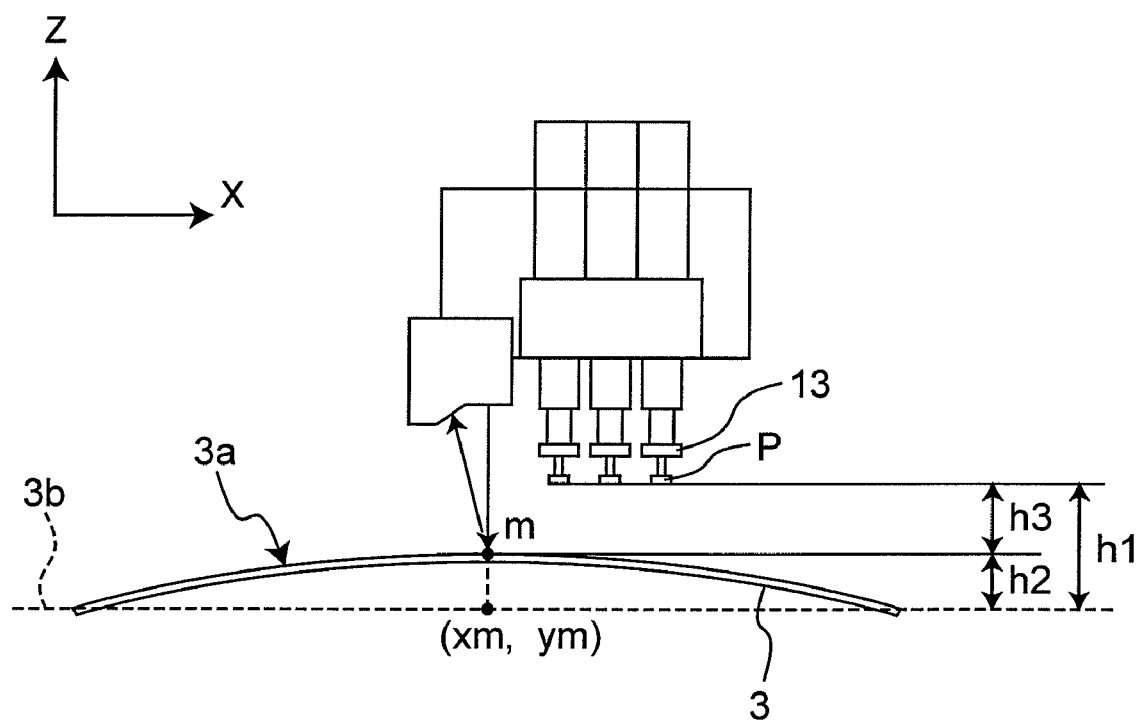
FIG. 7 is a schematic side view showing the state of electronic component mounting in the first embodiment.

In FIG. 7 that is a schematic view showing a state in which an electronic component is mounted in the mounting position of the circuit board 3, the mounting height in mounting the electronic component P in an arbitrary mounting spot m on the board surface 3a is h3. Therefore, by calculating a correction amount h2 by arithmetic processing of a displacement amount zm of the curved surface model 20 from the XY coordinates (xm, ym) of the mounting spot m as shown in FIG. 6 and carrying out the correction of subtracting the correction amount h2 from a mounting height h1 adjusted to the work reference surface 3b, the mounting height h3 is calculated. In the mounting position of the circuit board 3, by moving down the nozzle 13 that sucks and holds the electronic component P by the thus-corrected mounting height h3 by means of the elevation unit 12a and pressurizing the electronic component P against the circuit board 3 via a bonding material (e.g., a solder material) in the mounting position of the circuit board 3, the electronic component P can be mounted on the circuit board 3 with high accuracy.

Therefore, by thus inspecting the adaptability between the estimated curved surface model 20 and the board surface 3b, the curved surface model 20 approximated more closely to the shape of the actual board surface 3a is estimated, and the mounting height corrected on the basis of the displacement magnitudes of the curved surface model 20 from the work reference surface 3b is adjusted, leading to an improvement in the mounting quality. Moreover, since an accurate curved surface model 20 can be estimated by additionally setting the auxiliary measurement spots only when no adaptability is established while improving the efficiency by suppressing the number of measurement spots at the start of the estimation work, the connection can be accurately efficiently achieved with a smaller number of samples.

The reason why the prescribed threshold value is set to 0.3 mm in step ST4 and step ST8 is that an error margin of about 0.3 mm is tolerated for the displacement magnitude of the board surface 3a since about 0.3 mm is required as a depression quantity (quantity of depression in pressurization) of the electronic component to the circuit board by the nozzle 13 that is moved down for the mounting of the electronic component by driving the elevation unit 12a. Therefore, it is preferable to set on occasion a prescribed threshold value corresponding to the depression quantity of the nozzle 13 in terms of improving the mounting quality.

Figure 8:
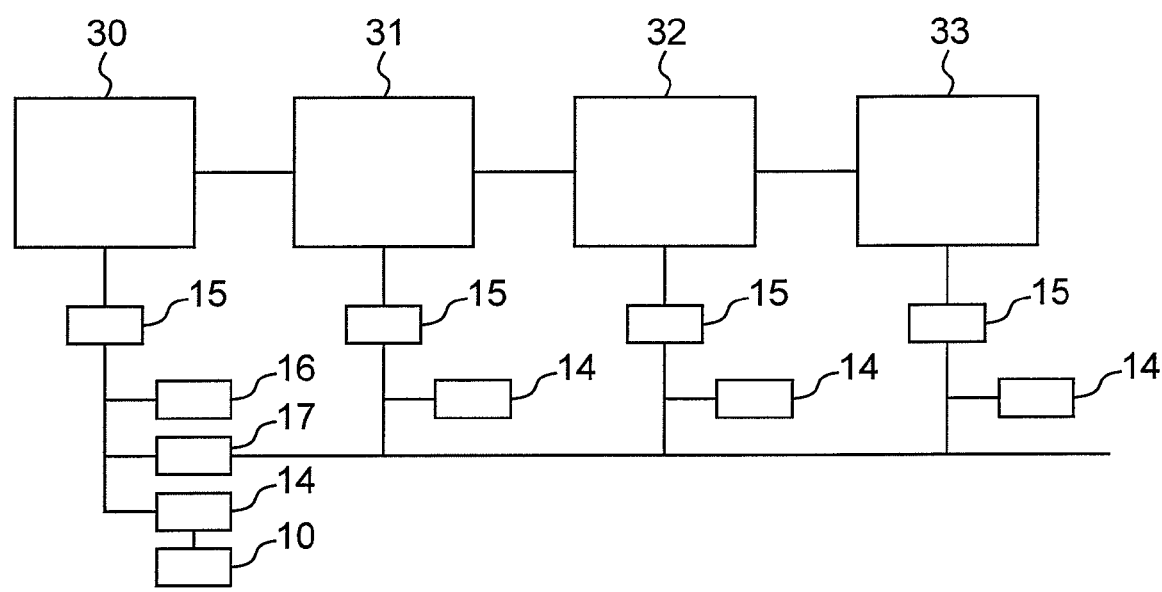
FIG. 8 is an explanatory view showing the construction of a board processing system including the electronic component mounting apparatus of the first embodiment.

A board work processing system constituted of a plurality of working apparatuses (hereinafter referred to as a board working apparatus) for a circuit board as represented by the electronic component mounting apparatus 101 of the present first embodiment is described next by using the schematic explanatory view shown in FIG. 8. In FIG. 8, the board work processing system is constituted by providing a plurality of board working apparatuses in order of processes. The board working apparatus 30 located in the uppermost stream of the processes is provided with a height detection sensor 10, an operation section 14, a control section 15 and a storage section 17 and constructed so that the displacement magnitudes of the mathematized curved surface model from the work reference surface, stored in the storage section 17, are calculated in the operation section 14 and the board surface is subjected to prescribed work processing by correcting the working height on the basis of the displacement magnitudes by means of the control section 15. The storage section 17 of the board working apparatus 30 is communicatably connected to a control system constructed of operation sections 14 and control sections 15 provided for board working apparatuses 31, 32, 33 provided on the downstream side of the processes. The board working apparatuses 31, 32, 33 are constructed so that the displacement magnitudes of the mathematized curved surface model from the work reference surface, stored in the storage section 17 of the board working apparatus 30, are calculated in the operation sections 14, and the board surface is subjected to the prescribed works by correcting the working height on the basis of the displacement magnitudes by means of the control sections 15.

As described above, by correcting the working height in the other board working apparatuses on the basis of the curved surface model estimated by the board working apparatus located at least in the uppermost stream of the processes in the board work processing system provided with the plural board working apparatuses for carrying out the prescribed work processing of the board, the mounting height is corrected by an identical curved surface model in all the processes of carrying out various works of a board, leading to an improvement in the working quality. Moreover, it is only required to provide the measuring means such as the height detection sensor 10 at least for the board working apparatus in the uppermost stream, and this therefore is economical. Furthermore, it becomes possible to shorten the working hours in each of the apparatuses since it is not necessary to measure the board surface every process, and this is therefore efficient.

The Second Embodiment

Figure 9A:
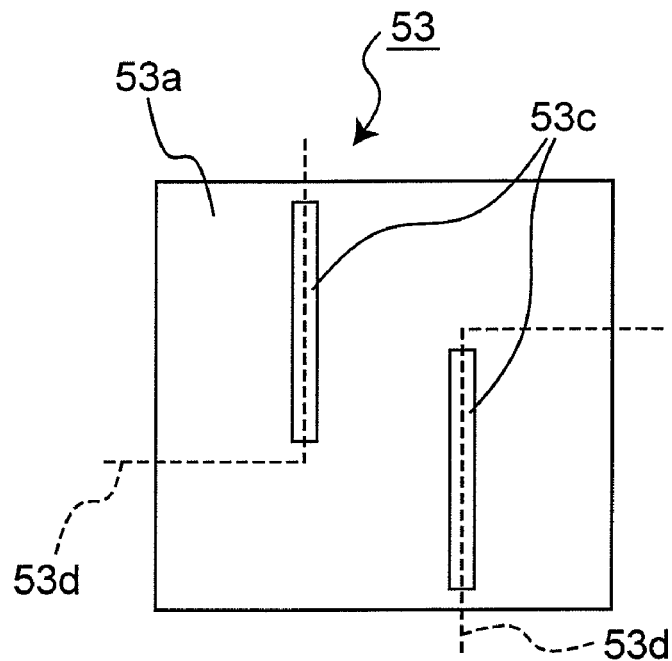
FIG. 9A is a schematic plan view showing a circuit board at which slits to be handled by the working apparatus for a circuit board according to a second embodiment of the present invention are formed.
Figure 9B:
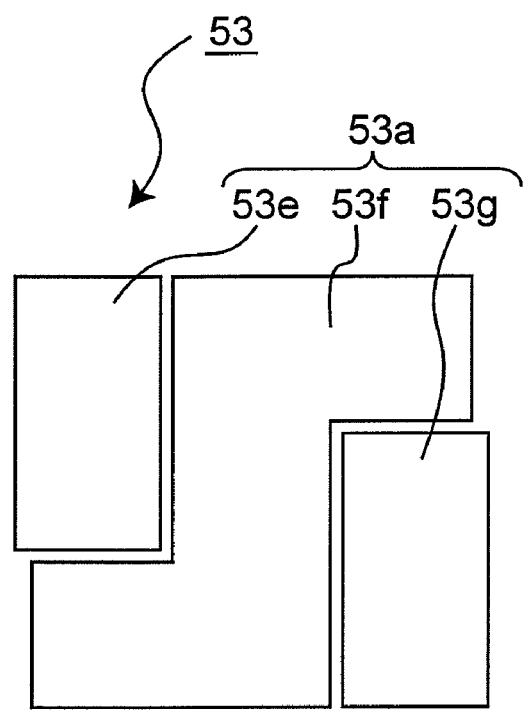
FIG. 9B is a schematic plan view showing a state in which the board surface of the circuit board of FIG. 9A is comparted into a plurality of regions.

The second embodiment of the present invention is described next. FIG. 9A is a schematic plan view showing a circuit board handled by the working apparatus for the circuit board of the present second embodiment. FIG. 9B is a plan view showing a state in which the board surface of the circuit board of FIG. 9A is comparted into a plurality of regions. Although the entire board surface 3a of the circuit board 3 is estimated by one curved surface model 20 in the first embodiment, the present second embodiment differs from it in that the shape of each comparted surface obtained by comparting a board surface 53a of a circuit board 53 into arbitrary regions is estimated by a curved surface model, and the shape of the entire board surface 53a is estimated by using the plurality of curved surface models. Only the point different from that of the first embodiment is described below.

FIG. 9A shows the circuit board 53 at which slits 53c, that is a plurality of opening portions are formed. In estimating the curved surface model of the board surface 53a where a discontinuity like the slit 53c exists, the board surface 53a is comparted into a plurality of regions with the positions where the slits 53c are formed served as parts of comparting lines 53d, so that the board surface 53a is comparted into, for example, three comparted surfaces 53e, 53f, 53g as shown in FIG. 9B. With regard to the comparted surfaces 53e, 53f, 53g, curved surface models of the comparted surfaces 53e, 53f, 53g are estimated as in the estimation of the curved surface model of the board surface in the first embodiment. The comparting lines 53d can be set by XY coordinate values by the input section 16 or may be selected from compartment patterns preparatorily stored in the storage section 17.

By thus combining the curved surface models estimated by comparting one board surface 53b into the plurality of comparted surfaces 53e, 53f, 53g, a discontinuous warp shape and a warp shape having a complicated curved surface can be estimated. Thereby, a curved surface model further adapted to the board surface 53a where the discontinuity exists due to the influence of a stepped portion, a slit, a cut portion or the like can be estimated. In each of the comparted surfaces 53e, 53f, 53g, the measurement of the displacement magnitudes and the estimation of the curved surface model should preferably be performed by setting measurement spots in at least three points or more preferably by setting measurement spots in the neighborhoods of corner portions and midpoints between them or other points.

In the present invention, the "auxiliary measurement spots" are auxiliary measurement spots set in the neighborhoods of the measurement spot for the purpose of determining whether the displacement magnitude measured in the "measurement spot" is eligible as the sampling displacement magnitude. Therefore, the auxiliary measurement spots are used for the determination of the eligibility and not used for the estimation of the curved surface model.

The circuit board generally includes a resist formation portion and an electrode formation portion, and these portions have varied light reflectances and so on. It is considered the case where the height data detected by the height position detection sensor is varied. Further, it is sometimes the case where the reflectance is varied even in a portion where a bonding material such as solder paste is placed on the circuit board. Therefore, the auxiliary measurement spots are set in the neighborhoods of the peripheries of the measurement spot to determine whether the displacement magnitude measured at the measurement spot is eligible. From such a viewpoint, it can be said that the auxiliary measurement spots are inappropriate if they extremely approach the measurement spot or extremely separate therefrom.

The limit of approach should preferably be, for example, not smaller than 0.3 mm which is the width of formation of the minimum electrode to be formed on the circuit board. The reason is that such an electrode is the minimum one of the undulations formed on the circuit board. The limit of separation should preferably be set, for example, not greater than 5 mm or not greater than 10 mm at maximum since the original purpose of supplementing the measured value of the measurement spot becomes unable to be achieved with extreme separation.

Moreover, in a case where electronic components are continuously mounted on a circuit board of an identical type in the electronic component mounting apparatus 101 of the first embodiment, it is also possible to estimate a curved surface model by setting a measurement spot and auxiliary measurement spots on the circuit board loaded first as described in the first embodiment, set the measurement spot in the same position as the measurement spot set on the circuit board loaded first and estimate a curved surface model without setting auxiliary measurement spots for the second and subsequent circuit boards. The reason is that, if the eligibility of the measurement spot as the sampling displacement magnitude is determined for the first circuit board, the step of determining the eligibility can be skipped by setting a measurement spot in the same position for the subsequent circuit boards. In such a case, the estimation of the curved surface model can efficiently be performed.

Moreover, although the description has been made taking the case where the working apparatus for the circuit board is the electronic component mounting apparatus as an example in each of the above embodiments, such a working apparatus can be applied also to a coating/printing apparatus for performing coating/printing of solder paste on the working surface of the circuit board, a bonding apparatus for mechanically and electrically bonding an electronic component to a circuit board by thermocompression bonding and reflow, a dicing apparatus for performing dicing into individual circuit boards when the circuit board is a multi-product board, and so on.

Next, serviceable contrivance points produced by implementation in combination with the working method for the circuit board of each of the above embodiments are described below.

When the circuit board is formed of, for example, a comparatively soft material and the amount of warp is disadvantageously increased, it can be considered the case where the circuit board interferes with the other constituent members that are placed or operating in the conveyance path of the circuit board or above its hold position. In order to prevent such a problem in advance, by comparing the amount of warp of the circuit board with a preset threshold value after estimating a curved surface model, a circuit board of a larger amount of warp is specified according to an increasing degree of concern of the interference with the other constituent members, and an error display of the work processing is outputted. As a result, the actual occurrence of the interference with the other constituent members can be prevented by stopping the work processing of the circuit board of which the amount of warp is large as described above.

Moreover, a method for further improving the height detection accuracy by a height detection sensor that detects the height of the measurement spot by projecting laser light can be carried out in combination with each of the above embodiments. In concrete, a vacuum sensor is provided in the path of vacuum suction of the nozzle for sucking and holding an electronic component, and the nozzle located at a certain height is gradually lowered while performing vacuum suction. Subsequently, the timing at which the vacuum pressure in the path of the vacuum suction remarkably rises is detected by the vacuum sensor, and the value of an encoder in the elevation unit of the nozzle at the timing is obtained. Such timing is the timing at which the tip end of the nozzle comes in contact with the board surface of the circuit board, and the height position of the board surface of the circuit board at the time point of contact of the nozzle can be detected by using the value of the encoder. Next, the height position of the board surface is detected by a height detection sensor in the same position on the circuit board. Next, a difference between the detected value by the height detection sensor and the height position detected by using the vacuum sensor of the nozzle used as a reference is calculated and stored as an offset correction amount. By correcting the manufacturing data (original data) itself by using such an offset correction amount, the measured value by the height detection sensor is corrected, and the curved surface model can be estimated with high accuracy. For example, when the height detected by the height detection sensor is 1.5 mm and the height position detected by the nozzle is 1.7 mm, the offset correction amount becomes +0.2 mm, and a value obtained by adding +0.2 mm to the height position subsequently obtained by the height detection sensor is handled as corrected height position data. It may be a case where a flow sensor for detecting the amount of vacuum suction is used in place of the case where the sensor for detecting the timing at which the nozzle comes in contact with the board surface is the vacuum sensor (pressure sensor).

The correction using such an offset correction amount is applicable not only to the case where the manufacturing data (original data) itself is directly corrected as described above but also to the case where the manufacturing data is corrected by detecting the height position using the nozzle every production lot of circuit boards (production group of circuit boards of the same type) in place of the above case.

Moreover, the detection of the height position using the nozzle should preferably be performed either in the group of the smoothest surface out of the groups of the measurement spot and the auxiliary measurement spots on the board surface of the circuit board or at measurement reference points preset for the circuit board.

It is to be noted that, by properly combining the arbitrary embodiments of the aforementioned various embodiments, the effects possessed by them can be produced.

According to the present invention, the working height can accurately be corrected by estimating the curved surface model approximated more closely to the shape of the board surface of the circuit board. Therefore, the advantage that the work quality can satisfactorily be maintained without reducing the work quality of the circuit board is provided even when a discontinuity exists due to the influences of a stepped portion, a slit, a cut portion or the like on the objective circuit board, with serviceability in a field in which an electronic component is mounted by subjecting a circuit board to prescribed works.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2005-343272 filed on Nov. 29, 2005, including specification, drawings and claims for patent, are incorporated herein by reference in its entirety.

The invention claimed is:

1. A working apparatus for a circuit board, the working apparatus comprising:
    a measuring means for measuring measurement displacement magnitudes of the circuit board from a work reference surface at each of at least three measurement spots set on a working surface of the circuit board and at least one corresponding auxiliary measurement spot set in a vicinity of at least one of the at least three measurement spots, respectively;
    an operation means for determining whether a difference between a maximum value and a minimum value of the measurement displacement magnitudes from the work reference surface measured by the measuring means at each of the at least three measurement spots and the at least one corresponding auxiliary measurement spot is not greater than a threshold value, estimating a shape of the working surface of the circuit board by a curved surface model based on the measurement displacement magnitudes of the at least three measurement spots that have been determined to have a difference between a maximum value of the measurement displacement magnitude and a minimum value of the measurement displacement magnitude not greater than the threshold value, and calculating operation displacement magnitudes of the curved surface model at curved surface model measurement spots on the curved surface model which correspond to the at least three measurement spots, on the work reference surface, used to estimate the curved surface model; and a correcting means for correcting a working height in performing works on the working surface of the circuit board on the basis of the operation displacement magnitudes of the curved surface model calculated by the operation means.

2. The working apparatus for a circuit board as defined in claim 1, further comprising:

an adaptability determining means for comparing the operation displacement magnitudes at each of the curved surface model measurement spots with the measurement displacement magnitudes at each of the at least three measurement spots used to estimate the curved surface model to determine whether a difference between each of the operation displacement magnitudes and each of the measurement displacement magnitudes, respectively, is not greater than a threshold value and determining that the curved surface model is adapted upon determining that the difference is not greater than the threshold value.

3. The working apparatus for a circuit board as defined in claim 1, wherein the operation means estimates a shape, for each of a plurality of compartment working surfaces obtained by compartmentalizing the working surface of the circuit board into a plurality of regions, the shape being based on the measurement displacement magnitude.

4. A working method for a circuit board, the method comprising:

setting at least three measurement spots on a working surface of the circuit board;

measuring measurement displacement magnitudes from a work reference surface of the circuit board at the at least three measurement spots;

determining whether a measurement displacement magnitude at each of the at least three measurement spots is eligible as a sampling displacement magnitude;

setting, upon a determination of ineligibility, a new measurement spot in place of one of the at least three measurement spots that has been determined to be ineligible and measuring the measurement displacement magnitude at the new measurement spot to determine eligibility of the measurement displacement magnitude at the new measurement spot, or estimating, upon a determination of eligibility, a shape of the working surface of the circuit board by a curved surface model based on the measurement displacement magnitude at each of the at least three measurement spots and calculating operation displacement magnitudes of the curved surface model at curved surface model measurement spots on the curved surface model which correspond to the at least three measurement spots, on the work reference surface, used to estimate the curved surface model; and performing works on the circuit board by correcting a working height in performing works on the working surface of the circuit board on the basis of the operation displacement magnitudes of the curved surface model.

5. The working method for a circuit board as defined in claim 4, wherein at least one corresponding auxiliary measurement spot is set in a vicinity of at least one of the at least three measurement spots, respectively, in setting the at least three measurement spots, the measurement displacement magnitude of each auxiliary measurement spot is measured in measuring the measurement displacement magnitudes, and it is determined that the measurement displacement magnitude is eligible in determining an eligibility of the measurement displacement magnitude, when a difference between a maximum value and a minimum value of the measurement displacement magnitudes at each of the at least three measurement spots and the at least one auxiliary measurement spot set in the vicinity of at least one of the at least three measurement spots, respectively, is not greater than a threshold value.

6. The working method for a circuit board as defined in claim 4, wherein it is determined, after the curved surface model is estimated, whether the curved surface model is adapted to the working surface of the circuit board, and when the curved surface model is determined to be not adapted, a new curved surface model is estimated by additionally setting a new measurement spot, in setting the at least three measurement spots.

7. The working method for a circuit board as defined in claim 6, wherein in determining an adaptability of the estimated curved surface model to the working surface of the circuit board, the operation displacement magnitude at each of the curved surface model measurement spots is compared with the measurement displacement magnitude at each of the at least three measurement spots, and it is determined that the curved surface model is adapted when a difference between each of the operation displacement magnitudes and the measurement displacement magnitudes, respectively, is not greater than a threshold value.

8. The working method for a circuit board as defined in claim 4, wherein in estimating the curved surface model, a shape of a compartment working surface is estimated by the curved surface model based on the measurement displacement magnitude for each compartment working surface obtained by compartmentalizing the working surface of the circuit board into a plurality of regions.

* * * * *